United States Patent [19]

Jamison et al.

[11] 3,994,105

[45] Nov. 30, 1976

[54] SHELTER CONSTRUCTION

[75] Inventors: John W. Jamison, Costa Mesa; Roy E. Denner; Robert R. Black, Jr., both of La Habre, all of Calif.

[73] Assignee: Hughes Aircraft Company, Culver City, Calif.

[22] Filed: Oct. 18, 1973

[21] Appl. No.: 407,753

Related U.S. Application Data

[63] Continuation of Ser. No. 235,893, March 20, 1972, abandoned.

[52] U.S. Cl. ............................... 52/127; 52/267; 52/285; 52/731; 52/753 Y
[51] Int. Cl.² ........................................... E04B 2/02
[58] Field of Search ............ 52/731, 127, 309, 479, 52/285, 609, 267, 615, 278, 270, 758 D, 753 Y, 753 D; 403/387

[56] References Cited
UNITED STATES PATENTS

| | | | |
|---|---|---|---|
| 2,458,074 | 1/1949 | Hill | 52/753 Y X |
| 2,877,508 | 3/1959 | Ewart | 52/267 X |
| 3,003,810 | 10/1961 | Kloote et al. | 52/288 |
| 3,013,103 | 12/1961 | Pettler et al. | 52/758 D X |
| 3,061,349 | 10/1962 | Dellith | 52/758 D |
| 3,211,253 | 10/1965 | Gonzalez | 161/68 X |
| 3,220,062 | 11/1965 | Hermann | 52/309 X |
| 3,292,323 | 12/1966 | Hagan | 52/127 |
| 3,310,926 | 3/1967 | Brandreth et al. | 52/731 X |
| 3,332,170 | 7/1967 | Bangs | 52/309 X |
| 3,363,378 | 1/1968 | Palfey | 52/285 X |
| 3,479,779 | 11/1969 | Ziegler | 52/309 X |
| 3,529,394 | 9/1970 | Wilkins | 161/68 X |
| 3,646,721 | 3/1972 | Becker | 161/68 X |
| R21,524 | 8/1940 | Gramelspacher | 52/753 D |

*Primary Examiner*—Price C. Faw, Jr.
*Assistant Examiner*—Leslie Braun
*Attorney, Agent, or Firm*—Allen A. Dicke; William H. MacAllister

[57] ABSTRACT

The shelter is constructed of composite, multilayer panels comprising an exterior skin aluminum sheet layer, a polymer composition foam layer, a divider skin aluminum sheet layer, an aluminum honeycomb layer, and an interior skin aluminum sheet layer. The five layers are bonded together to form the panel. In accordance with one aspect of the invention, the polymer composition foam layer has a scored surface to increase adhesive area and to increase the length of the shear failure line. In another aspect of the invention, the panels are closed out at at least two edges thereof with an extruded polymer-fiberglass closeout bar which is positioned between the inner and outer panel skins at the edge thereof and bonded thereto. These closeout bars are configured for rigid attachment between adjacent panels.

5 Claims, 5 Drawing Figures

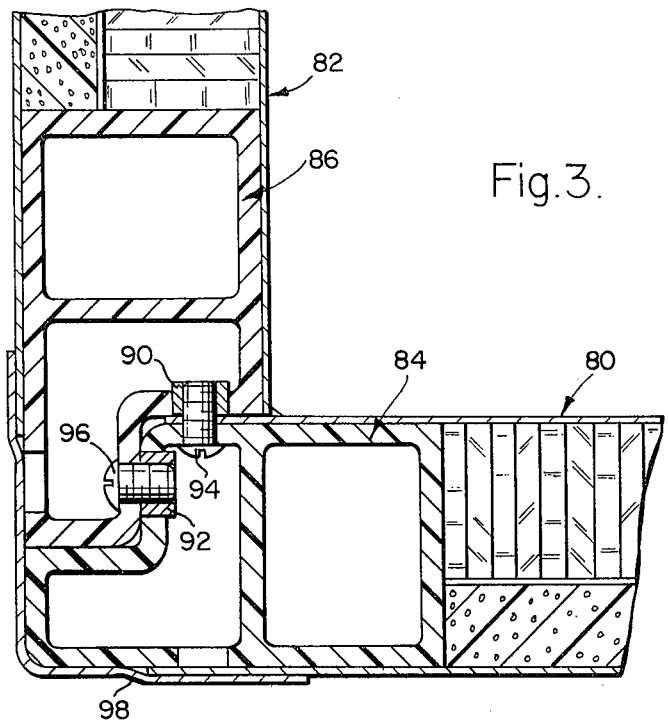
Fig. 3.
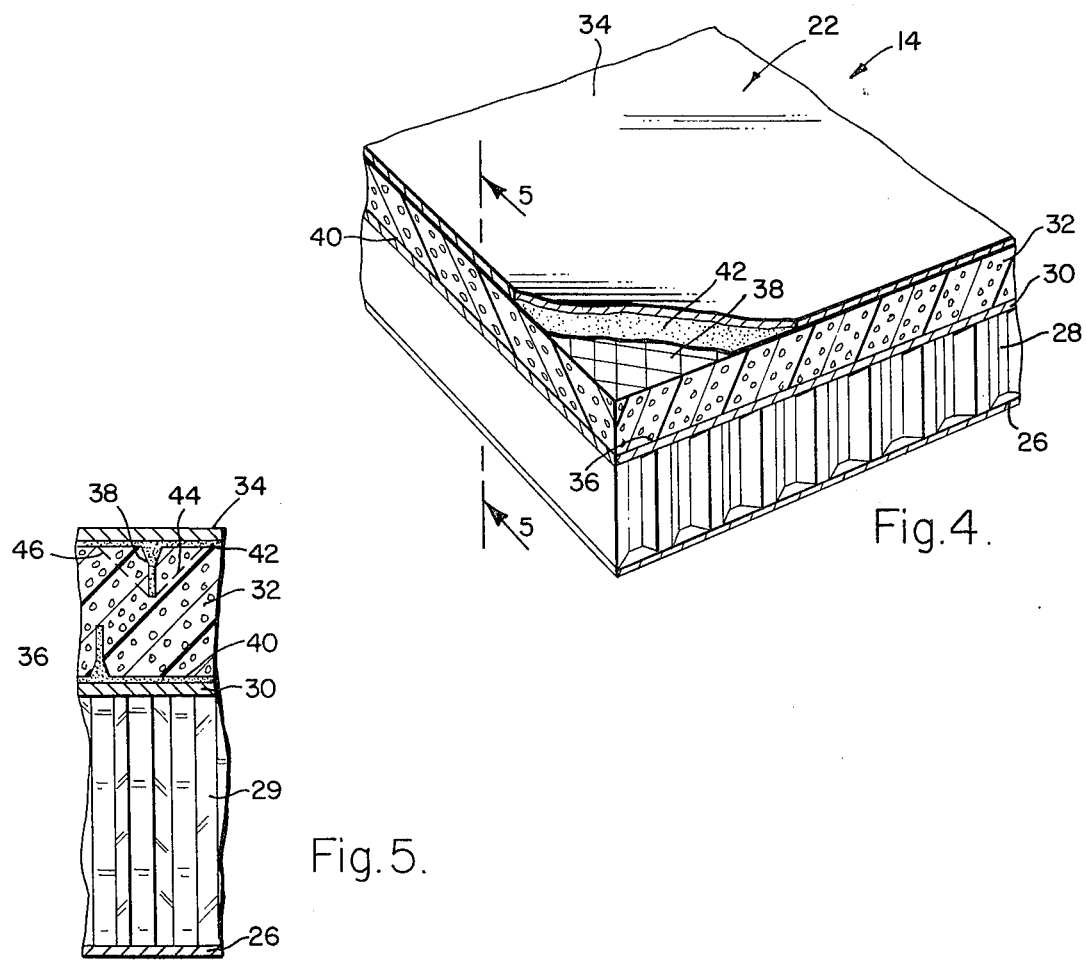
Fig. 4.
Fig. 5.

SHELTER CONSTRUCTION

CROSS REFERENCE

This is a streamlined continuation in Pat. Application Ser. No. 235,893, filed Mar. 20, 1972, now abandoned, by John W. Jamison et al. for "Shelter Construction," now abandoned. Patent applications Ser. No. 333,107, now abandoned, and 333,109 now Pat. No. 3,868,297, both filed Feb. 16, 1973 are divisional applications of that parent application.

BACKGROUND

This invention is directed to a shelter construction having appropriate panels and panel joints to provide thermal and structural integrity of the shelter to provide protection of contents in severe environmental conditions.

Shelters of various sorts have been built since the earliest beings on earth evidenced intelligence. The particular shelters of this invention are related to modern high performance concepts. Attention has been given to modular methods of containerization of equipment. While such as useful in military circumstances, it is also useful for other, non-millitary ends, where equipment protection is desired, together with mobility. Such situation is found at construction sites, particularly sites of heavy construction such as bridges, dams, highways, office buildings, and in oilfield use. The advantage of the modular technique is the relative ease with which equipment enclosed in such a shelter can be transported and deployed. As used with respect to this invention, the term "Shelter" refers to a special type of container which can be used to house equipment of electrical nature, or other types, and is large enough so that the equipment enclosed can be operated by technicians without removing the equipment from a shelter. Additionally, the shelter is weatherproof construction, since it may be deployed under extreme environmental conditions. While the shelter is expected to permanently house equipment under such conditions, it should be noted that the term "shelter" is applied to the housing rather than the combination, and furthermore, the shelter may be employed only to protect the equipment during transportation in cases where the equipment is subsequently unloaded.

Several manufacturers build shelters, and various panel constructions have been employed, but none of the shelters or panel constructions have been as advantageous as those described with respect to this invention. Previous panel constructions of sandwich construction have been the most successful. This prior construction consists of two relatively thin, high density, high strength facings bonded on opposite sides of a relatively thick, low density, low strength core. The facings carry the load in the plane of the panel, while the core carries shear stresses and resist compression loads normal to the plane of the panel. Aluminum facings of various thicknesses are generally employed. Paper honeycomb, polymer composition foam with or without reinforcement therein, plywood, and aluminum honeycomb have been used as core materials. However, each of these by itself has disadvantages when all environmental, weight and loading problems are considered. The principal shelter requirements which advise against the use of the above-listed core materials are the requirement of being moisture-proof, having adequate thermal insulation, having capacity for random insert installations and the weight limits imposed upon the finished shelters. The paper honeycomb provides high strength-to-weight ratio, but it cannot meet the moisture-proof requirements. Polymer composition foam alone is a thermal insulator of adequate value, but it has inadequate strength for random insert installation. Polymer composition foam with strengthening beams lying on edge therein satisfies the thermal and strength requirements, but is usually too heavy, is expensive to construct, and has no capacity for random insert installation. Plywood alone is too heavy. An aluminum honeycomb core does not satisfy the thermal requirements.

Once a panel of adequate thermal and structural properties has been achieved, it is also necessary to provide a means for joining two panels and/or terminating a panel edge. To accomplish this, closeouts and joints between panels must be provided. Flexible or semi-rigid joints charcterize the shelter assemblies of the prior art, with cost and ease of assembly being cited as the primary reasons for the flexible joint. It has also been argued that a flexibly-joined structure will be subjected to lower acceleration levels during shock loading. However, the primary failure of shelters is the leakage of moisture. This leakage is often the result of joint failure which has resulted from panel movement. The flexible joint construction used by several manfacturers consists of a thin-walled extrusion tee, or channel-angle combination fastened in some manner to attach intersecting panels. Several of this type, applicable to sandwich construction panels, are described in U.S. Pat. No. 2,986,245.

SUMMARY

In order to aid in the understanding of this invention, it can be stated in essentially summary form that it is directed to a shelter construction. According to one aspect of this invention, the shelter includes panels which are of composite construction including two outer metallic sheet layers, an inner sheet layer, with a honeycomb and a polymer composition layer between the sheet layers. The entire panel is bonded together so that the panel provides a high strength, low thermal conductivity and low weight panel for shelter construction. In accordance with another aspect of this invention, a panel has a polymer foam core, with the surface thereof provided with scores into which the adhesive securing the skin to the foam layer is intruded, to increase peel resistance. In accordance with yet another aspect of this invention, the shelter is built up of panels having inner and outer skins together with a core therebetween, together with a closeout bar on at least one panel edge. The closeout bar is adhesively secured between the skins, adjacent the core, and is configured for rigid attachment with a similar closeout bar.

Accordingly, it is an object of this invention to provide a shelter construction which includes a multilayer panel of adequate strength and minimum thermal conductivity and minimum weight characteristics and capacity for randomly-located insert installation using material which are highly resistant to water penetration and water damage. It is another object to provide such a panel in which a closeout bar is positioned in the edge thereof for panel attachment. It is yet another object to provide a closeout bar which is rigidly secured to the panel and can be rigidly secured to another closeout bar. It is yet another object to provide a closeout bar of extruded shape to provide a uniform cross section. It is still another object to provide a panel of multilayer construction, including a polymer foam layer wherein the skin is adhesively attached to the polymer foam. It is a further object to provide a scored surface on the polymer foam layer so that increased adhesive engagement is achieved to increase peel strength. It is still another object to provide a multilayer panel including inner and outer skins, with both polymer foam and honeycomb between the skins thereof. Other objects and advantages of this invention will become apparent from a study of the following portion of the specification, the claims, and the attached drawings.

BRIEF DESCRIPTION OF THE DRAWINGS

FIG. 3 is similar to FIG. 2, but showing such a joint secured with screws rather than rivets.

FIG. 4 is an enlarged broken-out part of the panel construction, with parts broken away, to show the several layers.

FIG. 5 is an enlaraged partial section taken generally along the line 5—5 of FIG. 4.

DESCRIPTION OF THE PREFERRED EMBODIMENTS

Figure 1:
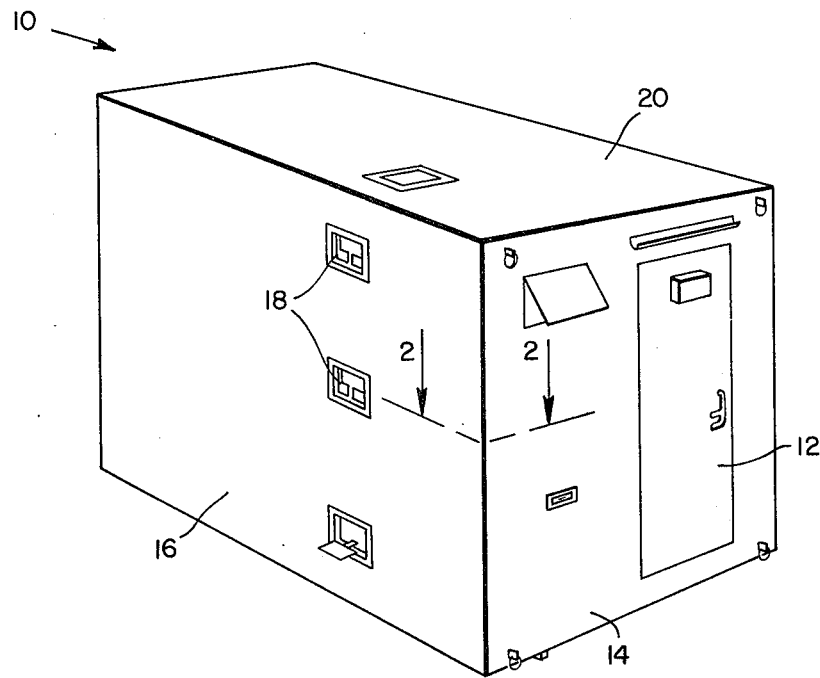
FIG. 1 is a perspective view of a shelter having panels and corner joints, in accordance with this invention.

Referring to FIG. 1, a shelter 10 is illustrated therein. In the preferred utility of the shelter construction of this invention, the shelter 10 is of sufficient size to contain and protect electronic equipment, and to permit the entry of personnel therein for using the equipment. In miliary situations, the shelter may contain communication equipment and operators, or may contain radar equipment, consoles and operators, and the like. In non-military utilization, the shelter may contain field instrumentation and recording equipment, or it may contain record storage and utilization equipment and a computer input, as might be employed at heavy construction sites. Thus, in the preferred embodiment, the shelter 10 is of such size as to permit the entry of personnel. To permit this entry, door 12 is provided in end 14. Various other devices to permit the utilization of the shelter by personnel can also be incorporated in the shelter, such as interior lighting and ventilation devices. Illustrated with respect to shelter side 16 are ladder elements 18 to permit convenient access to the top 20 of the shelter. In accordance with the preferred embodiment, the shelter 10 also has a far end, far side and bottom. Each of these six walls of the shelter is at least semi-permanently attached to the others to provide a complete, rigid structure. The shelter is intended to be permanently assembled, with disassembly of parts thereof only for special purposes: the shelter is not intended to be disassemblable for transporation in its preferred utilization.

While this disclosure is directed to a shelter 10 which is of such size as to permit entry of personnel therein for the purpose of access to equipment in the shelter for its utilization or repair, it is clear that, in accordance with the teachings of this invention, the structure thereof is equally useful for smaller enclosures, to protect the equipment enclosed therein from the environment.

Figure 2:
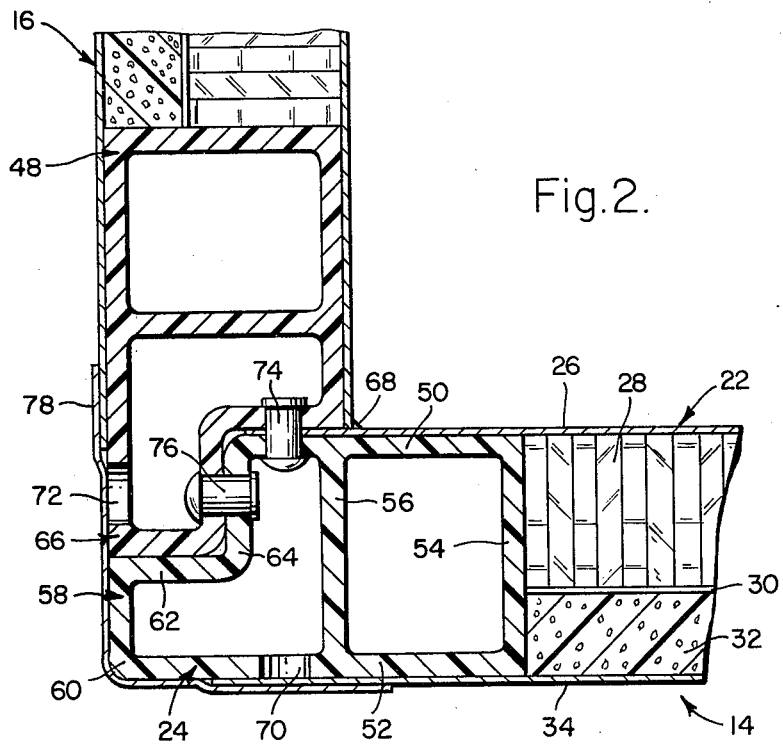
FIG. 2 is an enlarged partial section taken generally along the line 2—2 of FIG. 1.

The shelter construction of this invention comprises a panel construction which is useful with several types of corner joints, and a corner joint which is useful with several types of panel constructions. However, they are particularly useful with each other to define a panel having edges suitable for joining. Referring to FIG. 2, a portion of the end wall 14 is shown therein. The end wall 14 comprises a panel 22 finished at its edge with closeout 24, which serves as a joining device for the end wall 14 and the other walls of the shelter. First discussing the panel 22, each of the panels of the various walls is the same and comprises an inner skin 26, honeycomb core 28, divider skin 30, synthetic polymer composition rigid foam core 32, and outer skin 34. In the preferred embodiment, inner skin 26, honeycomb 28, and divider facing 30 are of aluminum with a corrosion protective finish. Usually, the divider skin 30 is thinner than the inner and outer skins, because it carries less of the load of the composite core panel 22. All elements — the skins, foam core 32, honeycomb core 28, and divider skin 30 — are adhesively secured together by means of a sheet-type adhesive cured at elevated temperature. The polymer foam core in the preferred embodiment is preferably a rigid foam of polymethacrylimid, of 3 pounds per cubic foot density, which is conveniently secured by high strength epoxy adhesive.

In the preferred embodiment, the outer skin 34 is also aluminum sheet. Other suitable structural foams are formed from polyvinychloride and polyurethane. Other skin materials include plywood and synthetic polymer composition sheets.

In order to obtain greater peel resistance of the bonding, an intersecting pattern of grooves 36 is cut on the side of foam core 32 toward divider skin 30, and an intersecting pattern of grooves 38 is cut on the side of the foam core 32 toward outer skin 34. These grooves should be cut to a depth of about half their lateral spacing as a maximum, and should be cut as narrow as possible consistent with the inflow of adhesive therein. Razor cuts are satisfactory, for the adhesive therein. Razor cuts are satisfactory, for the adhesive readily wets the surfaces. FIGS. 4 and 5 illustrate the adhesive layers 40 and 42, and FIG. 5 particularly shows the inflow of the adhesive into the grooves. When the adhesive identified above is employed, a razor cut groove is preferred.

The employment of these grooves improves the peel resistance of the skins from the polymer foam core by increasing the tear area or shear line in the foam core as the skin is peeled away. For example, if outer skin 34 were peeled away from polymer foam core 32, failure would occur about along the dotted lines 44 and 46 of FIG. 5.

As thus constructed, the panel construction provides thermal insulation capability, in accordance with the characteristics of the polymer foam. The thickness, density, and thermal conductivity of the polymer foam layer 32 can be selected so that an overall heat transfer coefficient consistent with shelter requirements can be obtained without appreciably affecting the shelter weight or strength. Furthermore, in this construction, potted insert fasteners can be inserted into the honeycomb at random locations to transmit unit loads into the inner skin 26 and divider skin 30. These inserts can be installed anywhere in the aluminum honeycomb core, and complete versatility exists as the number and location thereof without need for additional secondary supporting structure. Furthermore, the panel components are all highly insensitive to water damage and degradation, when compared to other panels. The honeycomb core, together with its inner skin and divider skin provides the strength and moisture resistant requirements of the shelter construction, so that balance results and optimum characteristics are realized. In cases where adequate core strength can be provided by structural foam, a two-skin structure with foam core is feasible.

FIG. 2 illustrates closeout 24 in the edge of panel 22, and closeout 48 in the edge of side panel 16. Each of the walls of shelter 10 is formed of panels, as previously described, and each of the panels must have a transitional member at the panel edges. The closeouts illustrated are the preferred panel construction, with the same closeout extending around all four peripheral edges of each panel. The closeouts are designed so that they cooperate with each other to seal, and can be employed in any corner, as well as between panels edgewise oriented and lying generally in the same plane. However, other joints can be used in specific locations, where desired. The particular corner joint construction illustrated in detail in FIGS. 2 and 3 need not necessarily be employed with, or only with, the specific panel construction illustrated in detail in FIGS. 4 and 5. With this understanding that the closeout edge joint described as being the preferred embodiment, but not necessarily the exclusive embodiment of closeout for the panels, the illustrative embodiments thereof are described below.

Each of the closeout bars 24 and 48, as well as the other bars, are of identical construction and are of uniform cross section so that they can be extruded and used for corner joints or edgewise joining of panels. Closeout 24 is illustrative and will be described in detail. Closeout 24 has walls 50 and 52 which are joined out by back cross web 54 and center cross web 56. Skins 26 and 34, respectively, lie against walls 50 and 52 with the back web 54 against the core material of panel 22. Conventional longitudinal openings are left during extrusion to reduce bar material and weight. The closeout 24 is placed in position during the assembly of the panel and is adhesively secured between the skins when the entire panel is completed. It is preferred that the back web 54 be adhesively secured to the core material at the same time. In addition, since it is adhesively secured to the skin and to the core, it is rigidly attached and is an integral part of the panel.

The forward end of the closeout bar includes a nose 58 which is defined by front web 60 and center wall 62. Center wall 62, together with center web 64, defines a recess into which the nose 66 of closeout 48 extends. Nose 58 is, in effect, a square, the side dimensions of which are half the distance between the outside of the skins 26 and 34 so that the recess into which nose 66 extends is of the same dimension. Thus, an interlocking nose and recess joint is provided.

In the case where panels are of different thickness, a corresponding number of closeout cross-sections are required. The material of the closeout bar is any convenient extrudable material. Aluminum extrusions supply some of the required properties, but where thermal conductivity is to be minimized, materials of lower thermal conductivity are employed. For example, a fibreglass-epoxy extrusion is desirable for this use. The strength is adequate, it is light of weight to minimize the total shelter weight, and is convenient for fastening, while providing the low thermal conductivity desirable. Since the inner skins of the two panels overlap, radio frequency interference and electromagnetic interference protection is maintained for the equipment within the shelter. If desired, an adhesive or paste containing an RFI and/or EMI conductive material can be applied at the juncture 68 to maintain sealing integrity.

Securement is accomplished by means of drilling through the outer walls, as at holes 70 and 72, to permit drilling of rivet holes and the installation and upsetting of rivets 74 and 76. After the joint is thus completed, an external scuff seal 78 is adhesively attached. Since the scuff seal overlaps the outer skins of the adjacent panels, when the scuff seal is aluminum to match the skin material and RFI-EMI material is included in the adhesive, additional sealing integrity is provided.

If it is desired that the joints between panels be conveniently later demountable, without the need for drilling out rivets such as rivets 74 and 76, machine screws can be used as an alternative fastening between the closeout bars. Referring to FIG. 3, panels 80 and 82 identical to panels 22 and 16, have closeout bars 84 and 86 identical to closeout bars 24 and 28. After the drilling for the fasteners, threaded inserts 90 and 92 are adhesively secured in holes for the reception of machine screws 94 and 96.

In an alternative embodiment, the space between webs 56 and 64 could be full, or web 64 more heavy so adequate thread engagement therein eliminates the need for an insert, and the holes can be tapped directly into the web. A suitable RFI-EMI compound is inserted in a joint at a time of securement but, in this case, it is preferably not in adhesive vehicle. After the shelter is assembled, it may be demounted by removal of the scuff seal 98, followed by removal of the machine screws at the several joints. It may be desired that every joint be demountable, so that the entire shelter can be disassembled. On the other hand, it may be desirable that only one of the side wall panels be demountable so that equipment access is achieved, either for maintenance of the equipment or for the installation and removal of larger pieces of equipment.

The particular advantages of the joint include the fact that such a joint provides a highly efficient structural joint (due to the configuration and fastener placement) which is weather-proof and moisture resistant. Furthermore, the joint provides shielding against radio frequency interference and electromagnetic interference, between the contents of the shelter and the exterior environment. It must also be noted that the corner joint does not have exposed rivets or other fasteners due to the placement of the fasteners and the scuff seal. The external scuff seal at the corners provides abrasion resistance for rugged enviromental usage, in addition to full enclosure and sealing. Furthermore, there are no interior gussets, fillets, or doublers which would reduce corner space in the shelter. The entire shelter assembly is a structure where tension, bending, and shear loads are effectively distributed over the cross section of each panel and are transferred through the joints between the panels to allow full utilization of the structural properties of the sandwich composite panels, while maintaining thermal insulation. Since all joints in the shelter assembly are identical, except for variations in panel thickness, shelter panels can be produced en masse and later be fitted together. Furthermore, since the joints are structural and suitable for assembly/disassembly cycling, it is possible to remove a shelter panel after assembly of the shelter, as described above, with convenient reinstallation of the panel. It will be appreciated that a shelter manufactured with such panels and egde joint structures can be assembled in various different sizes from modular panel sized to provide great versatility.

This invention having been described in its preferred embodiment, and alternative embodiments also disclosed, it is clear that it is susceptible to numerous modifications and embodiments within the ability of those skilled in the art and without the exercise of the inventive faculty. Accordingly, the scope of this invention is defined by the scope of the following claims.

What is claimed is:

1. A shelter formed of a plurality of panels, each of said panels comprising:

first and second panel skins;

a core between said skins and secured to said skins to space said skins apart a first dimension;

an extruded attachment bar of substantially uniform cross section positioned between said skins and having a thickness substantially equal to said first dimensions, said attachment bar having an extrusion opening therethrough, said attachment bar having first and second walls, said first and second skins extending past said core to extend at least partway respectively across said first and second walls, said skins being secured to said walls of said attachment bar;

said attachment bar having a nose defined by a front web and a center wall, a center web extending transversely to said nose, said front web being attached to said first attachment bar wall and to said center wall, said center web being attached to said center wall and to said second attachment bar wall so that said first attachment bar wall is secured to said second attachment bar wall, said extrusion opening being defined by the interiors of said walls and webs, said attachment bar having a recess defined by said center wall and said center web, said nose and said recess each being substantially equal to half said first dimension;

said noses and recesses on attachment bars on the edges of adjacent first and second panels being interengaged so that said walls and webs of said noses and recesses lie against each other and said front web on said first panel lies in line with said first wall of said second panel when said panels are interengaged at right angles and said first wall of said first panel lies in line with said second wall of said second panel when said panels are interengaged in line with each other; and tensile fastening means engaged on said adjacent walls and webs within the interior of said attachment bars to compressively secure said adjacent walls and webs against each other.

2. The shelter of claim 1 wherein said tensile attachment means comprises a rivet engaging said adjacent walls and webs by having its head in one extrusion opening and its riveted flange in the other extrusion opening.

3. The shelter of claim 1 wherein said tensile securing means is a screw having its thread threadedly engaged in one of said interengaged walls and webs and its head engaged on the other thereof.

4. The shelter of claim 1 wherein there is an opening through said first wall substantially in line with said tensile fastening device to permit installation of said tensile fastening device.

5. The shelter of claim 4 further including a seal cover extending from said skin secured to said first wall on one of said panels to said skin secured to said first wall of the other of said panels, said seal cover extending across said tensile securing means access opening.

* * * * *